(12) United States Patent
Venkatasubramanian et al.

(10) Patent No.: US 10,312,137 B2
(45) Date of Patent: Jun. 4, 2019

(54) HARDMASK LAYER FOR 3D NAND STAIRCASE STRUCTURE IN SEMICONDUCTOR APPLICATIONS

(71) Applicant: Applied Materials, Inc., Santa Clara, CA (US)

(72) Inventors: Eswaranand Venkatasubramanian, Santa Clara, CA (US); Susmit Singha Roy, Mountain View, CA (US); Pramit Manna, Sunnyvale, CA (US); Abhijit Basu Mallick, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/175,880

(22) Filed: Jun. 7, 2016

(65) Prior Publication Data
US 2017/0352586 A1 Dec. 7, 2017

(51) Int. Cl.
| | |
|---|---|
| *H01L 21/033* | (2006.01) |
| *H01L 21/768* | (2006.01) |
| *H01L 23/522* | (2006.01) |
| *H01L 23/528* | (2006.01) |
| *H01L 27/1157* | (2017.01) |
| *H01L 27/11524* | (2017.01) |
| *H01L 27/11556* | (2017.01) |
| *H01L 27/11582* | (2017.01) |

(52) U.S. Cl.
CPC .... *H01L 21/76816* (2013.01); *H01L 21/0332* (2013.01); *H01L 21/0335* (2013.01); *H01L 21/0337* (2013.01); *H01L 21/0338* (2013.01); *H01L 21/76877* (2013.01); *H01L 23/5226* (2013.01); *H01L 23/5283* (2013.01); *H01L 27/1157* (2013.01); *H01L 27/11524* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 5,236,550 A | 8/1993 | Abt et al. | |
| 5,407,855 A | 4/1995 | Maniar et al. | |
| 5,821,169 A * | 10/1998 | Nguyen | G03F 7/00 216/41 |
| 6,331,483 B1 * | 12/2001 | Ishizuka | C23C 16/0281 257/E21.17 |

(Continued)

*Primary Examiner* — David E Graybill
(74) *Attorney, Agent, or Firm* — Patterson + Sheridan, LLP

(57) ABSTRACT

Embodiments of the present disclosure provide an apparatus and methods for forming a hardmask layer that may be utilized to transfer patterns or features to a film stack with accurate profiles and dimension control for manufacturing three dimensional (3D) stacked semiconductor devices. In one embodiment, a method of forming a hardmask layer on a substrate includes forming a seed layer comprising boron on a film stack disposed on a substrate by supplying a seed layer gas mixture in a processing chamber, forming a transition layer comprising born and tungsten on the seed layer by supplying a transition layer gas mixture in the processing chamber, and forming a bulk hardmask layer on the transition layer by supplying a main deposition gas mixture in the processing chamber.

14 Claims, 5 Drawing Sheets

(56) References Cited

U.S. PATENT DOCUMENTS

| | | | |
|---|---|---|---|
| 7,109,098 B1* | 9/2006 | Ramaswamy | H01L 21/02118 |
| | | | 438/513 |
| 7,312,148 B2* | 12/2007 | Ramaswamy | H01L 21/76843 |
| | | | 257/E21.333 |
| 7,312,162 B2* | 12/2007 | Ramaswamy | C23C 16/26 |
| | | | 257/E21.27 |
| 7,323,401 B2* | 1/2008 | Ramaswamy | C23C 16/26 |
| | | | 257/E21.029 |
| 7,335,611 B2* | 2/2008 | Ramaswamy | B23K 26/0608 |
| | | | 438/795 |
| 7,422,775 B2* | 9/2008 | Ramaswamy | H05H 1/46 |
| | | | 427/572 |
| 7,429,532 B2* | 9/2008 | Ramaswamy | G03F 1/54 |
| | | | 257/E21.035 |
| 8,647,989 B2* | 2/2014 | Wu | H01L 21/76802 |
| | | | 257/E21.25 |
| 9,125,333 B2* | 9/2015 | Uzoh | H05K 3/4007 |
| 9,230,983 B1 | 1/2016 | Sharangpani et al. | |
| 9,536,734 B2* | 1/2017 | Hanashima | H01L 21/0228 |
| 9,560,773 B2* | 1/2017 | Uzoh | H05K 3/4007 |
| 9,634,412 B2* | 4/2017 | Uzoh | H01R 13/03 |
| 9,969,622 B2* | 5/2018 | Lei | C01B 35/146 |
| 2006/0024948 A1* | 2/2006 | Oh | H01L 21/76807 |
| | | | 438/622 |
| 2006/0260545 A1* | 11/2006 | Ramaswamy | C23C 16/26 |
| | | | 118/719 |
| 2006/0263540 A1* | 11/2006 | Ramaswamy | H05H 1/46 |
| | | | 427/569 |
| 2006/0264060 A1* | 11/2006 | Ramaswamy | C23C 16/26 |
| | | | 438/758 |
| 2007/0026685 A1* | 2/2007 | Bae | H01L 21/0332 |
| | | | 438/736 |
| 2007/0032004 A1* | 2/2007 | Ramaswamy | H01L 21/76843 |
| | | | 438/197 |
| 2007/0032054 A1* | 2/2007 | Ramaswamy | C23C 16/26 |
| | | | 438/513 |
| 2007/0032082 A1* | 2/2007 | Ramaswamy | G03F 1/54 |
| | | | 438/689 |
| 2007/0032095 A1* | 2/2007 | Ramaswamy | B23K 26/0608 |
| | | | 438/795 |
| 2007/0231010 A1* | 10/2007 | Ohta | G03G 15/0291 |
| | | | 399/168 |
| 2008/0292798 A1* | 11/2008 | Huh | C23C 16/342 |
| | | | 427/343 |
| 2009/0078676 A1 | 3/2009 | Yamada et al. | |
| 2012/0264306 A1* | 10/2012 | Wu | H01L 21/76802 |
| | | | 438/702 |
| 2013/0014978 A1* | 1/2013 | Uzoh | H05K 3/4007 |
| | | | 174/257 |
| 2013/0014979 A1* | 1/2013 | Uzoh | H01R 13/03 |
| | | | 174/257 |
| 2014/0027664 A1* | 1/2014 | Lei | C01B 35/146 |
| | | | 252/62.3 R |
| 2015/0079501 A1 | 3/2015 | Shoki et al. | |
| 2015/0228474 A1* | 8/2015 | Hanashima | H01L 21/0228 |
| | | | 438/778 |
| 2015/0243499 A1* | 8/2015 | Yamamoto | C23C 16/52 |
| | | | 438/763 |
| 2015/0318294 A1* | 11/2015 | Wang | H01L 27/11548 |
| | | | 257/315 |
| 2016/0149002 A1 | 5/2016 | Sharangpani et al. | |
| 2016/0155627 A1* | 6/2016 | Hanashima | H01L 21/0228 |
| | | | 438/786 |
| 2016/0204117 A1* | 7/2016 | Liu | H01L 29/66825 |
| | | | 257/324 |
| 2016/0300848 A1 | 10/2016 | Pachamuthu et al. | |
| 2017/0207087 A1* | 7/2017 | Roy | H01L 21/02175 |
| 2018/0187307 A1* | 7/2018 | Yoshida | H01L 21/31 |

* cited by examiner

HARDMASK LAYER FOR 3D NAND STAIRCASE STRUCTURE IN SEMICONDUCTOR APPLICATIONS

BACKGROUND

Field

Embodiments of the present disclosure generally relate to methods of manufacturing a vertical type semiconductor device, and more particularly to methods of manufacturing a hardmask layer for manufacturing a vertical type semiconductor device.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. In manufacturing three dimensional (3D) stacking of semiconductor chips, stair-like structures are often utilized to allow multiple interconnection structures to be disposed thereon, forming high-density of vertical transistor devices.

Furthermore, the demands for greater integrated circuit densities also impose demands on the process sequences used in the manufacture of integrated circuit components. For example, in process sequences that use conventional photo lithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer. Thus, a highly selective etchant enhances accurate pattern transfer.

As the geometry limits of the structures used to form semiconductor devices are pushed against technology limits, the need for accurate pattern transfer for the manufacture of structures having small critical dimensions and high aspect ratios and structures with different materials has become increasingly difficult to satisfy. For example, the thickness of the energy sensitive resist has been reduced in order to control pattern resolution. Such thin resist layers (e.g., less than about 2000 Å) can be insufficient to mask underlying material layers during the pattern transfer step due to attack by the chemical etchant. An intermediate layer, called a hardmask layer, is often used between the energy sensitive resist layer and the underlying material layers to facilitate pattern transfer because of its greater resistance to chemical etchants. Conventionally, silicon oxynitride, silicon carbine or carbon films are often the materials utilized for the hardmask layer.

During etching, the hardmask layer utilized to transfer patterns to the materials is exposed to aggressive etchants for a significant period of time. After a long period of exposure to the aggressive etchants, the hardmask layer without sufficient etching resistance may be dimensionally changed, resulting in inaccurate pattern transfer and loss of dimensional control. Furthermore, the similarity of the materials selected for the hardmask layer and the adjacent layers disposed in the film stack (such as the repeating layers in a film structure utilized for manufacturing stair-like three dimensional NAND devices) may also result in similar etch properties therebetween, thus resulting in poor selectivity during etching. Poor selectivity between the hardmask layer and adjacent layers may result in non-uniform, tapered and deformed profile of the hardmask layer, thereby leading to poor pattern transfer and failure of accurate structure dimension control.

Thus, there is a need for an improved hardmask layer for structures with accurate profiles and dimension control, particularly, for three dimensional (3D) stacking of semiconductor devices.

SUMMARY

Embodiments of the present disclosure provide an apparatus and methods for forming a hardmask layer that may be utilized to transfer patterns or features to a film stack with accurate profiles and dimension control for manufacturing three dimensional (3D) stacked semiconductor devices. In one embodiment, a method of forming a hardmask layer on a substrate includes forming a seed layer comprising boron on a film stack disposed on a substrate by supplying a seed layer gas mixture in a processing chamber, forming a transition layer comprising boron and tungsten on the seed layer by supplying a transition layer gas mixture in the processing chamber, and forming a bulk hardmask layer on the transition layer by supplying a main deposition gas mixture in the processing chamber.

In another example, a hardmask layer includes a hardmask layer comprising a seed layer, a transition layer and a bulk hardmask layer disposed on the transition layer.

In yet another example, a method of forming a hardmask layer includes supplying a gas mixture including at least a boron-based gas and a nitrogen-based gas onto a surface of a substrate disposed in a processing chamber to form a seed layer on the substrate, gradually ramping down the boron-based gas and gradually ramping up a tungsten-based gas supplied in the gas mixture while maintaining a steady flow of the nitrogen-based gas into the processing chamber to form a transition layer on the seed layer, and continuously supplying the tungsten-based gas in the gas mixture until the tungsten-based gas reached to a predetermined flow rate and maintaining the tungsten-based gas at a steady predetermined flow rate to form a bulk hardmask layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

The present disclosure provides methods for forming a hardmask layer on a film stack which may be later utilized to form stair-like structures on a substrate for three dimensional (3D) stacking of semiconductor devices. In one example, precise dimension control, accurate feature transfer, superior electrical performance and good process control during manufacturing may be obtained by utilizing a hardmask layer with desired robust film properties as well as high etching selectivity during the film stack patterning process. In one example, the hardmask layer may be a tungsten (W) containing material with nitrogen dopants formed therein, such as a tungsten nitride (WN) layer. The hardmask layer may include a seed layer comprising boron and a transition layer comprising boron and tungsten followed by a bulk hardmask layer comprising tungsten formed on the seed layer. The tungsten nitride (WN) layer provides high etching selectivity as well as high etching resistant to the layers disposed under the hardmask layer, such as repeating layers of silicon oxide and silicon nitride layers, thus providing advantageous film profile control during for film patterning processes, thus forming film structures, such as stair-like structures, with desired profile and dimensions. The hardmask layer also has desired low surface roughness as well as desired grain structures and sizes.

Figure 1:
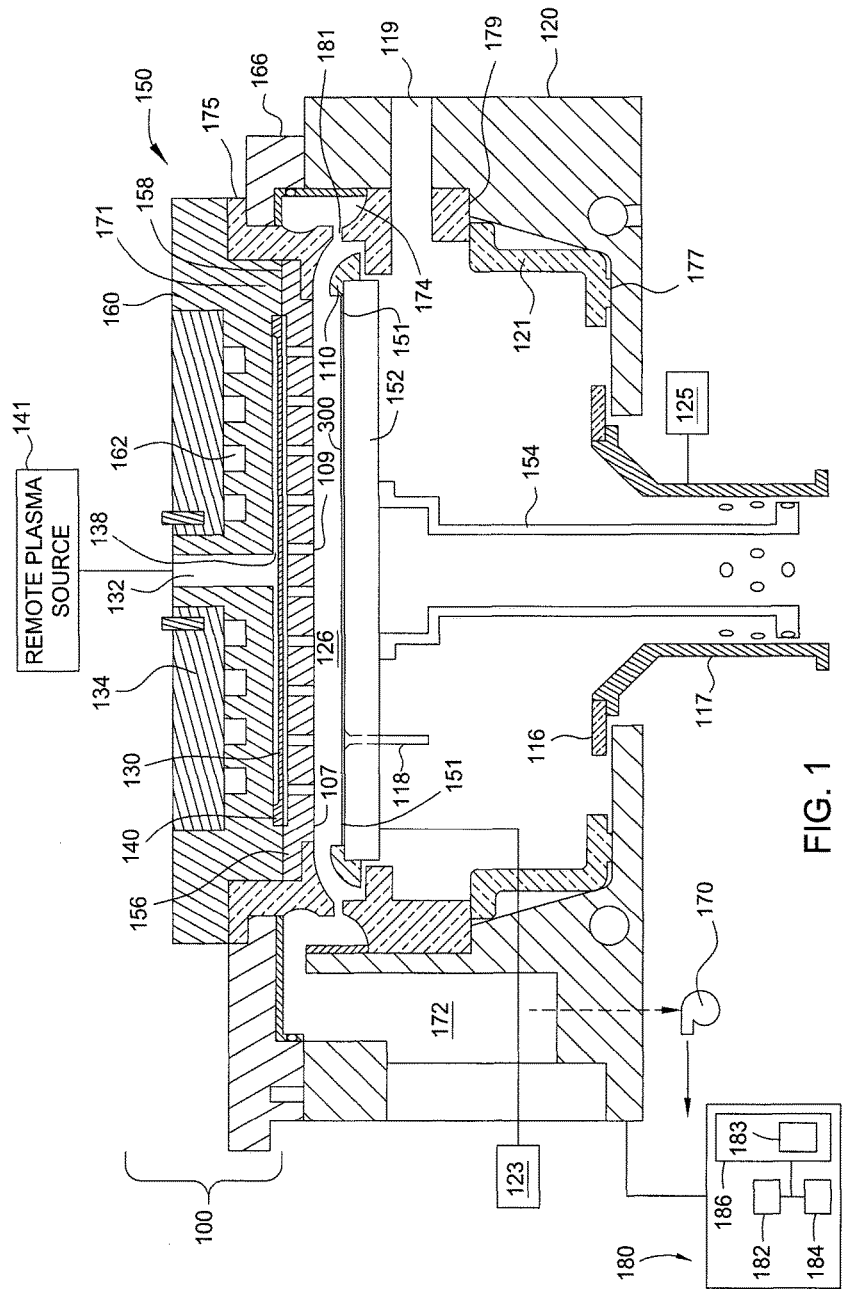
FIG. 1 depicts an apparatus utilized to form a hardmask layer on a film stack disposed on a substrate in accordance with one embodiment of the present disclosure.

FIG. 1 illustrates a processing chamber 150 has a chamber body 120 enclosed by a lid assembly 100. The processing chamber 150 that may be used to form a hardmask layer, such as a metal containing hardmask layer by chemical vapor deposition processes as described herein. The hardmask layer may contain metallic tungsten, metallic tungsten nitride, derivatives thereof, or combinations thereof. A processing chamber 150 may be used to perform CVD, plasma enhanced-CVD (PE-CVD), pulsed-CVD, ALD, PE-ALD, derivatives thereof, or combinations thereof. Water channels, such as a liquid channel 162, may be used to regulate the temperature of a lid assembly 100 during the vapor deposition process for depositing a cobalt-containing material. In one embodiment, the lid assembly 100 may be heated or maintained at a temperature within a range from about 100° C. to about 300° C., such as from about 125° C. to about 225° C., and for example from about 150° C. to about 200° C. The temperature is maintained during the vapor deposition process of a cobalt-containing material and/or nickel containing material.

A showerhead 156 has a relatively short upwardly extending rim 158 secured to a gas box plate 160. Both the showerhead 156 and the gas box plate 160 may be formed from or contain a metal, such as aluminum, stainless steel, or alloys thereof. The liquid channel 162 is formed in the top of the gas box plate 160 and covered and sealed by a water cooling cover plate 134. Water is generally flown through the liquid channel 162. However, alcohols, glycol ethers, and other organic solvents may be used solely or mixed with water to transfer heat away from or to the lid assembly 100. The liquid channel 162 is formed in a serpentine though generally circumferential path having bends (e.g., three sharp U-turns or U-shaped bends) as the path progresses from the inside to the outside until the path returns to the inside in a radial channel (not shown). The liquid channel 162 is narrow enough to ensure that the flow of water becomes turbulent, thus aiding the flow of heat from the flange of the gas box plate 160 to the water in the liquid channel 162. A liquid temperature regulating system (not shown) may be attached to the liquid channel 162 and used to transfer heat away from or to lid assembly 100. In one example, the lid assembly 100 is configured to be heated or maintained at a temperature of about 150° C. and is in fluid communication with a source of a tungsten precursor, such as tungsten fluorine, and a source of a nitrogen precursor, such as $N_2$.

The extending rim 158 of the showerhead 156 is attached to the bottom rim 171 of the gas box plate 160. Both rims 158 and 171 are maximally sized between encompassing a lid isolator 175 and an encompassed lower cavity 130 of the showerhead 156. The showerhead 156 secured to the gas box plate 160 in a manner that ensures good thermal contact over a large contact area. The thermal flow area extends from the outside at the lid isolator 175 (except for a gap between the lid isolator 175 and either the showerhead 156 or the gas box plate 160) to the inside at a lower cavity 130. The structure of the liquid channels 162 provides efficient thermal transfer between the water and the gas box plate 160. The mechanical interface between the flange of gas box plate 160 and showerhead 156 ensures efficient thermal transfer between the gas box plate 160 and the showerhead 156. Accordingly, cooling of the showerhead 156 is greatly enhanced.

The processing chamber 150 further contains a heater pedestal 152 connected to a pedestal stem 154 that may be vertically moved within the processing chamber 150. The heater portion of the heater pedestal 152 may be formed of a ceramic material. In its upper deposition position, the heater pedestal 152 holds a substrate 300 in close opposition to a lower surface 107 of the showerhead 156. A processing region 126 is defined between the heater pedestal 152 and the lower surface 107 of the showerhead 156. The showerhead 156 has a plurality of apertures or holes 109 communicating between the lower cavity 130 and the processing region 126 to allow for the passage of processing gas. The processing gas is supplied through the gas port 132 formed at the center of the water-cooled gas box plate 160. The upper side of the gas box plate 160 is covered by a water cooling cover plate 134 surrounding the upper portion of the gas box plate 160 that includes a gas port 132. The gas port 132 supplies the processing gases to an upper cavity 138 which is separated from the lower cavity 130 by a blocker plate 140. The blocker plate 140 has a large number of holes 109 disposed therethrough. In one embodiment, the cavities 130 and 138, showerhead 156, and blocker plate 140 evenly distribute the processing gas over the upper face of the substrate 300.

The substrate 300 may be supported on the heater pedestal 152, which is illustrated in a raised, deposition position. In a lowered, loading position, a lifting ring 116 is attached to a lift tube 117 which lifts four lift pins 118. The lift pins 118 fit to slide into the heater pedestal 152 so that the lift pins 118 can receive the substrate 300 loaded into the chamber through a loadlock port 119 in a chamber body 120. In one embodiment, the heater pedestal 152 may contain an optional confinement ring 110, such as during plasma-enhanced vapor deposition processes.

A side purge gas source 123 may be coupled to the processing chamber 150 and configured to supply purge gas to an edge portion 151 of the substrate 300 as needed. In one embodiment, the gases may be supplied from the side purge gas source 123 to the substrate 300 edge portion 151. The gases may be a hydrogen gas, argon gas, nitrogen gas, helium gas, combinations thereof, or the like. Furthermore, a bottom purge gas source 125 may also be coupled to the chamber 150 to supply the purge gas from the bottom of the chamber 150 to the substrate 300 surface. Similarly, the purge gas supplied from the bottom purge gas source 125 may include a hydrogen gas, argon gas, nitrogen gas, helium gas, combinations thereof, or the like.

A lid isolator 175 is interposed between showerhead 156 and a lid rim 166, which can be lifted off the chamber body 120 to open the processing chamber 150 for maintenance access. The vacuum within processing chamber 150 is maintained by a vacuum pump 170 connected to a pump plenum 172 within the processing chamber 150, which connects to an annular pumping channel 174.

An annular chamber liner 179 made of quartz is disposed in the processing chamber 150 which defines a side of the annular pumping channel 174 but also partially defines a further choke aperture 181 disposed between the processing region 126 and the annular pumping channel 174. The annular chamber liner 179 also supports the confinement ring 110 in the lowered position of the heater pedestal 152. The chamber liner 179 also surrounds a circumference at the back of the heater pedestal 152. The chamber liner 179 rests on a narrow ledge in chamber body 120, but there is little other contact, so as to minimize thermal transport. Below the chamber liner 179 is located a Z-shaped lower chamber shield 121, made of opaque quartz. The lower chamber shield 121 rests on the bottom of chamber body 120 on an annular boss 177 formed on the bottom of the lower chamber shield 121. The quartz prevents radiative coupling between the bottom of the heater pedestal 152 and the chamber body 120. The annular boss 177 minimizes conductive heat transfer to the chamber body 120. In an alternative embodiment, the lower chamber shield 121 includes an inwardly extending bottom lip joined to a conically shaped upper portion conforming to the inner wall of chamber body 120. While this alternative design is operationally satisfactory, the sloping shape is much more expensive to fabricate in quartz.

In one embodiment, a remote plasma source 141 may be coupled to the processing chamber 150 through a gas port 132 to supply disassociated species of the processing gases from the remote plasma source 141 through the plurality of holes 109 in the showerhead 156 to the processing chamber 150 to the substrate 300 surface. It is noted that the remote plasma source 141 may be coupled to the processing chamber 150 in any suitable position to supply disassociated species to the substrate 300 surface as needed. Suitable gases that may be supplied to the remote plasma source 141 to be dissociated and further delivered to the substrate 300 surface include hydrogen, argon, helium, nitrogen, ammonia, combinations thereof and the like.

In FIG. 1, a control unit 180 may be coupled to the chamber 150 to control processing conditions. The control unit 180 comprises a central processing unit (CPU) 182, support circuitry 184, and memory 186 containing associated control software 183. The control unit 180 may be one of any form of a general purpose computer processor that can be used in an industrial setting for controlling various chambers and sub-processors. The CPU 182 may use any suitable memory 186, such as random access memory, read only memory, floppy disk drive, compact disc drive, hard disk, or any other form of digital storage, local or remote. Various support circuits may be coupled to the CPU 182 for supporting the chamber 150. The control unit 180 may be coupled to another controller that is located adjacent individual chamber components. Bi-directional communications between the control unit 180 and various other components of the chamber 150 are handled through numerous signal cables collectively referred to as signal buses, some of which are illustrated in FIG. 1.

Figure 2:
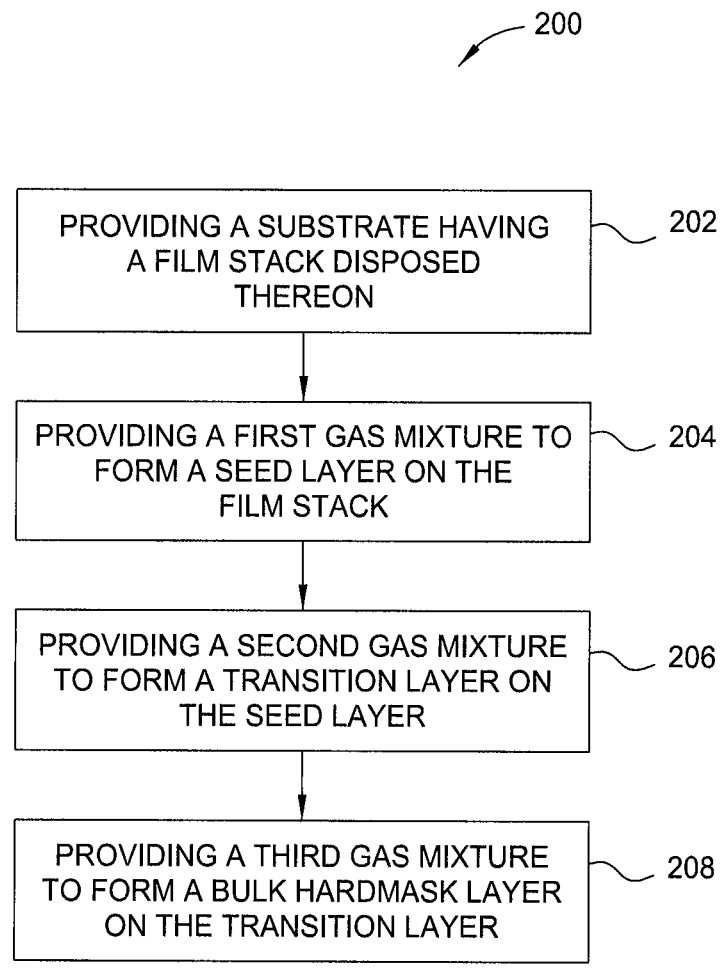
FIG. 2 depicts a flow diagram of a method for forming a hardmask layer on a film stack disposed on a substrate in accordance with one embodiment of the present disclosure.

FIG. 2 is a flow diagram of one embodiment of a method 200 for forming a hardmask layer. The hardmask layer formed on a film stack may be utilized to form stair-like structures in the film stack. FIGS. 3A-3D are schematic cross-sectional views illustrating a sequence for forming a hardmask layer on a film stack disposed on a substrate according to the method 200. Although the method 200 is described below with reference to a hardmask layer that may be formed on a film stack utilized to manufacture stair-like structures in the film stack for three dimensional semiconductor devices, the method 200 may also be used to advantage in other device manufacturing applications.

Figure 3A:
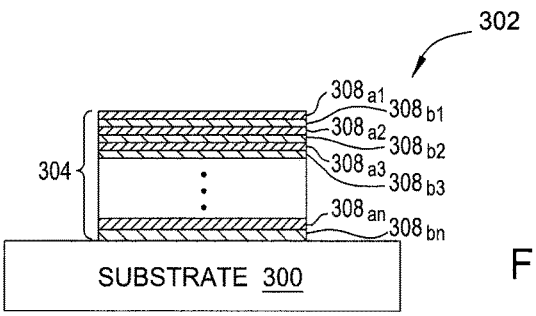
FIGS. 3A-3D depict one embodiment of a sequence for forming a hardmask on a film stack formed on a substrate in accordance with the embodiment depicted in FIG. 2.

The method 200 begins at operation 202 by transferring a substrate, such as a substrate 300 depicted in FIG. 3A, into a processing chamber, such as the processing chamber 150 depicted in FIG. 1. The substrate 300 may be a silicon based material or any suitable insulating materials or conductive materials as needed, having a film stack 304 disposed on the substrate 300 that may be utilized to form a structure 302, such as stair-like structures, in the film stack 304.

As shown in the exemplary embodiment depicted in FIG. 3A, the substrate 300 may have a substantially planar surface, an uneven surface, or a substantially planar surface having a structure formed thereon. The film stack 304 is formed on the substrate 300. In one embodiment, the film stack 304 may be utilized to form a gate structure, a contact structure or an interconnection structure in the front end or back end processes. The method 200 may be formed on the film stack 304 to form the stair-like structures therein used in a memory structure, such as NAND structure. In one embodiment, the substrate 300 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 300 may have various dimensions, such as 200 mm, 300 mm, 450 mm or other diameter wafers, as well as, rectangular or square panels. Unless otherwise noted, embodiments and examples described herein are conducted on substrates with a 200 mm diameter, a 300 mm diameter, a 450 mm diameter substrate. In the embodiment wherein a SOI structure is utilized for the substrate 300, the substrate 300 may include a buried dielectric layer disposed on a silicon crystalline substrate. In the embodiment depicted herein, the substrate 300 may be a crystalline silicon substrate.

In one embodiment, the film stack 304 disposed on the substrate 300 may have a number of vertically stacked layers. The film stack 304 may comprise pairs including a first layer (shown as $308a_1, 308a_2, \ldots, 308a_n$) and a second layer (shown as $308b_1, 308b_2, \ldots, 308b_n$) repeatedly formed in the film stack 304. The pairs includes alternating first layer (shown as $308a_1, 308a_2, \ldots, 308a_n$) and second layer (shown as $308b_1, 308b_2, \ldots, 308b_n$) repeatedly formed until desired numbers of pairs of the first layers and the second layers are reached.

Figure 3B:
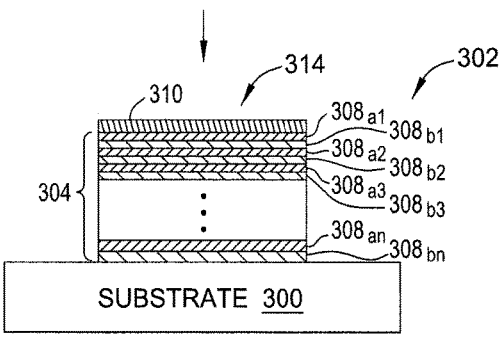
Figure 3C:
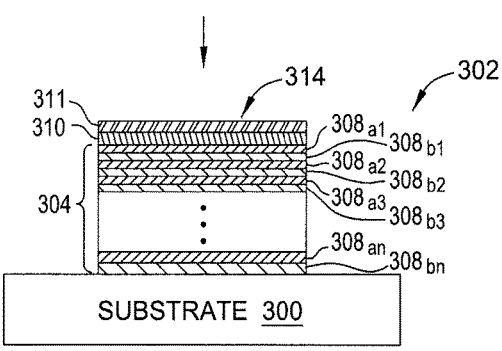

The film stack 304 may be a part of a semiconductor chip, such as a three-dimensional (3D) memory chip. Although three repeating layers of first layers (shown as $308a_1, 308a_2, \ldots, 308a_n$) and second layers (shown as $308b_1, 308b_2, \ldots, 308b_n$) are shown in FIG. 3A-3C, it is noted that any desired number of repeating pairs of the first and the second layers may be utilized as needed.

In one embodiment, the film stack 304 may be utilized to form multiple gate structures for a three-dimensional (3D) memory chip. The first layers $308a_1, 308a_2, \ldots, 308a_n$, formed in the film stack 304 may be a first dielectric layer and the second layers $308b_1, 308b_2, \ldots, 308b_n$ may be a second dielectric layer. Suitable dielectric layers may be utilized to form the first layers $308a_1, 308a_2, \ldots, 308a_n$ and the second layer $308b_1, 308b_2, \ldots, 308b_n$ include silicon oxide, silicon nitride, silicon oxynitride, silicon carbide, silicon oxycarbide, titanium nitride, composite of oxide and nitride, at least one or more oxide layers sandwiching a nitride layer, and combinations thereof, among others. In some embodiments, the dielectric layers may be a high-k material having a dielectric constant greater than 4. Suitable examples of the high-k materials include hafnium dioxide ($HfO_2$), zirconium dioxide ($ZrO_2$), hafnium silicon oxide ($HfSiO_2$), hafnium aluminum oxide (HfAlO), zirconium silicon oxide (ZrSiO2), tantalum dioxide ($TaO_2$), aluminum oxide, aluminum doped hafnium dioxide, bismuth strontium titanium (BST), and platinum zirconium titanium (PZT), among others.

In one particular example, the first layers $308a_1, 308a_2, \ldots, 308a_n$ are silicon oxide layers and the second layers $308b_1, 308b_2, \ldots, 308b_n$ are silicon nitride layers or polysilicon layers disposed on the first layers $308a_1, 308a_2, \ldots, 308a_n$. In one embodiment, the thickness of first layers $308a_1, 308a_2, \ldots, 308a_n$ may be controlled at between about 50 Å and about 1000 Å, such as about 500 Å, and the thickness of the each second layers $308b_1, 308b_2, \ldots, 308b_n$ may be controlled at between about 50 Å and about 1000 Å, such as about 500 Å. The film stack 304 may have a total thickness between about 100 Å and about 2000 Å. The total thickness of the film stack 304 is about 3 microns to 10 microns and will vary as the technology advances.

It is noted that the hardmask layer may be formed on any surfaces or any portion of the substrate 300 with or without the film stack 304 present on the substrate 300.

At operation 204, after the substrate 300 is transferred to the processing chamber, such as the processing chamber 150 depicted in FIG. 1, a seed layer gas mixture is supplied into the processing chamber 150 to deposit a seed layer 310 on the film stack 304, as shown in FIG. 3B. During deposition of the seed layer 310, the process parameters utilized to ignite and form the plasma in the gas mixture may be dynamically controlled or preset to a predetermined flow rate to facilitate depositing the seed layer 310 with desired film properties and film microstructure. In one embodiment, the seed layer gas mixture may include a boron-based gas and a nitrogen-based gas and optionally a hydrogen-based gas. Suitable boron-based gases include, but are not limited to, trimethylboron ($B(CH_3)_3$ or TMB), diborane ($B_2H_6$), boron trifluoride ($BF_3$), and triethylboron ($B(C_2H_5)_3$ or TEB) and combinations thereof. Suitable nitrogen-based gases include, but are not limited to, nitrogen gas ($N_2$), $NH_3$, $N_2O$, $NO_2$, NO and the like. Suitable hydrogen-based gases include, but are not limited to, $H_2$, $H_2O$, $H_2O_2$ and combinations thereof.

In one embodiment, the boron-based gas described herein is diborane ($B_2H_6$) and the nitrogen-based gas described herein is nitrogen ($N_2$) and/or $NH_3$. The optional hydrogen-based gas is $H_2$. In some examples, inert gas, such as Ar or He may also be optionally supplied in the seed layer gas mixture as needed.

Figure 4:
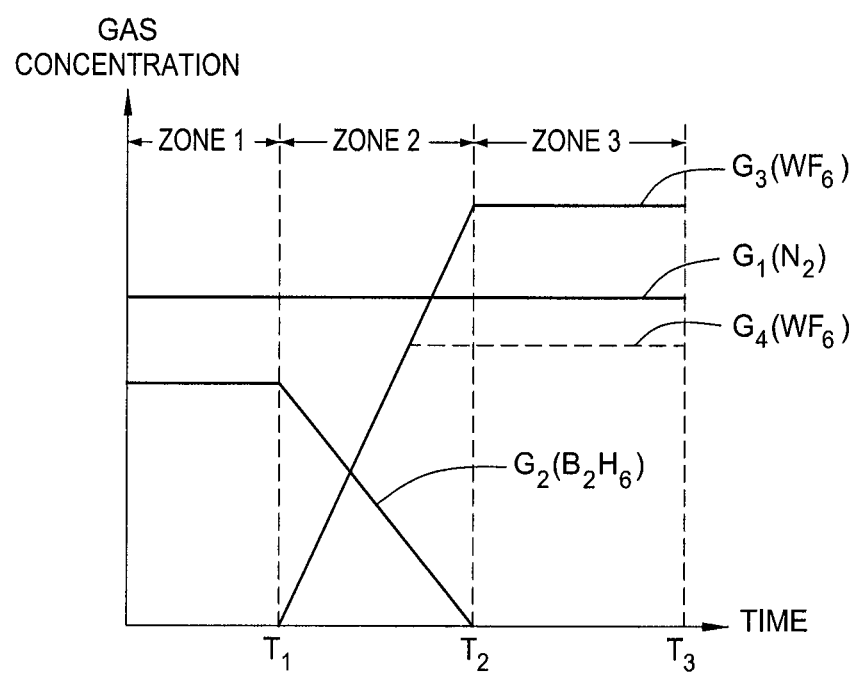
FIG. 4 depicts a gas flow rate diagram for forming a hardmask layer in accordance with one embodiment of the present disclosure.

In one embodiment, the boron-based gas (shown as the trace line $G_2$ in FIG. 4) and the nitrogen-based gases gas (shown as the trace line $G_1$ in FIG. 4), such as the $N_2$ and/or $NH_3$ gas, supplied in the seed layer gas mixture may be supplied at a preset flow rate (e.g., predetermined flow value) for a first time period from the beginning of the method 200 to a first predetermined time point $t_1$ during the seed layer deposition process, indicated in Zone 1 of FIG. 4. In the time period of Zone 1, the gas flow of the boron-based gas, shown as the trace line $G_2$, and the nitrogen-based gases gas, shown as the trace line $G_1$, is remained steady when forming the seed layer 310 in the operation 204 until the seed layer 310 reaches to a predetermined thickness. In one example, the seed layer 310 may a thickness between about 0.5 nm and about 10 nm.

The seed layer 310 is formed at a steady rate so as to maintain the seed layer 310 with low defect density to promote interface adhesion to the underlying film stack 304. In one embodiment, the boron-based gas supplied at operation 204 for forming the seed layer 310 is controlled at between about 20 sccm and about 2000 sccm from the first predetermined time point $t_1$ for between 2 seconds and about 30 seconds. The nitrogen-based gas flow supplied at operation 204 for forming the seed layer 310 is controlled at between 100 sccm and about 5000 sccm. Alternatively, the gases supplied in the seed layer gas mixture may be controlled at a ratio of the boron-based gas to the nitrogen-based gas between about 1:2 and about 1:50.

During deposition of the seed layer 310, several process parameters may be regulated the process. In one embodiment suitable for processing a 300 mm substrate, the process pressure may be maintained at about 0.1 Torr to about 80 Torr, for example, about 1 Torr to about 20 Torr. A RF source power between about 100 Watts and about 1000 Watts is supplied in the seed layer gas mixture. A RF bias power between about 0 Watts and about 500 Watts may be optionally supplied in the seed layer gas mixture. The spacing between the substrate and showerhead may be controlled at about 200 mils to about 1000 mils. The substrate temperature of the deposition process is maintained between about 300 degrees Celsius and about 900 degrees Celsius, such as between about 480 degrees Celsius.

At operation 206, after the seed layer 310 is formed on the film stack 304, a second gas mixture, such as a transition gas mixture, is supplied to the substrate surface. The processing gases supplied in the transition gas mixture may be dynamically controlled to facilitate transiting the seed layer gas mixture to a main deposition gas mixture performed at operation 208 after the supply of the transition gas mixture is completed. After the seed layer 310 has reached to a desired thickness, in the transition gas mixture, the ratio of the boron-based gas to nitrogen-based gas may be changed. The transition gas mixture may include at least the gradually ramped down boron-based gas and the continuously steady gas flow of nitrogen-based gas from the seed layer gas mixture from operation 204. In addition to the gradually ramped-down boron-based gas mixture and the steady flow of the nitrogen based gas mixture from seed layer gas mixture, a tungsten-based gas may be newly introduced in the transition gas mixture at operation 206. Suitable tungsten-based gases include, but are not limited to, $WF_6$, WC, $W(CO)_6$ or any suitable tungsten halide gases (such as $WX_n$, where X are halogen species including F, Cl, Br and I and n is integer between 1 and 6) and combinations thereof. In one example, the tungsten-based gas supplied in the transition gas mixture is $WF_6$.

It is noted that the term "ramp up" used herein means gradually increasing a process parameter from a first time set point to a second time set point over a predetermined time period with a desired ramp-up rate. The term "ramp up" used herein is not a sudden change caused by an action of throttle to other valve opening and closing.

When supplying the transition gas mixture into the processing chamber, the tungsten-based gas may be gradually ramped up from a second time period, shown as the trace line $G_3$ in the time zone 2 of FIG. 4, from the first predetermined time point $t_1$ to a second predetermined time point $t_2$. During the time period indicated by time zone 2, the flow of the nitrogen-based gas, shown as gas trace line $G_1$ remains steady.

In operation 206 of transitioning the gas supply from the seed layer gas mixture at operation 204 (e.g., time zone 1 of FIG. 4) prior to supplying a main deposition gas mixture at operation 208 (e.g., time zone 3 of FIG. 4), which will be described later below, the transition gas mixture as supplied may deposit a transition layer 311 on the seed layer 310, as shown in FIG. 3C. The transition layer 311 as formed on the seed layer 310 may have a gradient film structure with a varying atomic concentration with the growth of the transition layer 311. It is believed that the gradual ramp-up of the tungsten-based gas flow and the gradual ramp-down of the boron-based gas flow in the transition gas mixture may assist increasing the tungsten atomic concentration within the deposited film while gradually reducing the boron atomic concentration uniformly, thus assisting adhering and distributing the tungsten atoms on the substrate surface to react with the nitrogen atoms (e.g., constantly supply in the gas mixtures) with desirable film properties and low defect density. As the tungsten-based gas flow is gradually ramped up and the boron-based gas flow is gradually ramped down, the transition layer 311 formed on the substrate may be a gradient boron-tungsten-nitride (BWN) layer with a higher boron concentration (e.g., lower tungsten concentration) close to the substrate surface while with a lower boron centration (e.g., higher tungsten concentration) with the increase of the thickness of the transition layer 311. The gases supplied in the transition gas mixture may be dynamically and constantly varied and adjusted so as to allow the transition layer 311 to provide a smooth transition with different film properties (e.g., from a BN layer to a WN layer later formed in the main deposition process in operation 208). Uniform adherence of the boron, tungsten and nitrogen atoms with low defect density formed on the substrate surface provides good nucleation sites for the subsequent atoms to nucleate thereon so as to promote a desired grain structure, grain size and low film roughness. The nitrogen-based gas flow supplied in the transition gas mixture may be kept steady as needed and the ramp-up of the tungsten-based gas as well as the ramp-down of the boron-based gas flow to form the transition layer 311 with the desired gradient film bonding structure in preparation for the main deposition process at operation 208.

In one embodiment, the ramp-down rate of the boron-based gas supplied at operation 206 may be between about 5 sccm per second and about 500 sccm per second until the boron-based gas supplied to the processing chamber is terminated at the second predetermined time point $t_2$, as shown in FIG. 4. Similarly, the ramp-up rate of the tungsten-based gas supplied at operation 206 may be between about 5 sccm per second and about 100 sccm per second until the tungsten-based gas supplied to the processing chamber has reached a predetermined gas flow rate at the second predetermined time point $t_2$. The nitrogen-based gas flow supplied at operation 206 for forming the transition layer 311 is kept at a steady flow rate of at between 100 sccm and about 10000 sccm. In one example, the ramp-up rate of the tungsten-based gas in the transition gas mixture may be controlled similar to, greater or slower than the ramp-down rate of the boron-based gas. In one specific example, the ramp-up rate of the tungsten-based gas in the transition gas mixture is controlled similar to the ramp-down rate of the boron-based gas.

During deposition of the transition layer 311, several process parameters may be regulated the process. In one embodiment suitable for processing a 300 mm substrate, the process pressure may be maintained at about 0.1 Torr to about 80 Torr, for example, about 1 Torr to about 20 Torr. A RF source power between about 100 Watts and about 1000 Watts is supplied in the seed layer gas mixture. A RF bias power between about 0 Watts and about 500 Watts may be optionally supplied in the transition gas mixture. The spacing between the substrate and showerhead may be controlled at about 200 mils to about 1000 mils. The substrate temperature of the deposition process is maintained between about 300 degrees Celsius and about 900 degrees Celsius, such as between about 480 degrees Celsius.

Figure 3D:
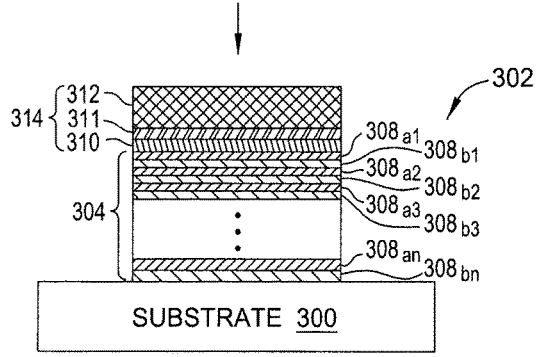

At operation 208, after the flow of transition gas mixture is terminated, a third gas mixture, such as a main deposition gas mixture, may be supplied into the processing chamber to form a bulk hardmask layer 312 on the transition layer 311, as shown in FIG. 3D. Thus, the hardmask layer 314 formed on the film stack 304 in total includes the seed layer 310, the transition layer 311 and the bulk hardmask layer 312. While forming the bulk hardmask layer 312 in time zone three for a predetermined period of time, the tungsten-based gas supplied in the gas mixture may be gradually ramped up (from the transition gas mixture at operation 206 in time zone two) until a desired gas flow rate has reached at operation 208, as shown in gas trace line $G_3$ in time zone 3 of FIG. 4. Dynamically adjusting the gas flow ratio when performing the gas transition from the transition gas mixture at operation 206 to the main deposition gas mixture at operation 208, the bulk hardmask layer 312 may be formed having certain film properties as desired.

As the tungsten-based gas (e.g., the gas trace line $G_3$) has reached to a predetermined flow rate when entering into time zone three of operation 208, as shown in FIG. 4, the flow rate of the tungsten-based gas controlled for depositing the bulk hardmask layer 312 may be held steady as well as the nitrogen-based gas (e.g., the gas trace line $G_1$) continuously supplied which switches from the transition gas mixture to the main deposition gas mixture. The main deposition gas mixture may be supplied for the second predetermined time point $t_2$ to a third predetermined time point $t_3$. In one example, the main deposition process may be performed for between about 20 seconds and about 400 seconds to form the bulk hardmask layer 312 having a thickness between about 50 nm and about 1000 nm.

In one example, the gases supplied in the main deposition gas mixture include at least the tungsten-based gas and the nitrogen gas. A hydrogen containing gas may be optionally supplied in the main deposition gas mixture as needed. In one example, the gases supplied in the main deposition gas mixture include $WF_6$, $N_2$ and/or $NH_3$ and $H_2$. In some examples, inert gas, such as Ar or He may also be optionally supplied in the main deposition gas mixture as needed. In such example, the bulk hardmask layer 312 formed on the film stack 304 is a tungsten nitride (WN) layer.

In one embodiment, the tungsten-based gas (shown as the trace line $G_3$ in FIG. 4) and the nitrogen-based gases gas (shown as the trace line $G_1$ in FIG. 4), such as the $N_2$ and/or $NH_3$ gas, supplied in the deposition gas mixture may be supplied at a preset flow rate (e.g., predetermined flow value) from the second predetermined time point $t_2$ to the third predetermined time point $t_3$ during the main deposition process, indicated in time zone 3 of FIG. 4. It is noted that the trace line $G_3$ in FIG. 4 depicts that the tungsten-based gas is flowed at a rate greater than the flow rate of the nitrogen-based gas, such as the trace line $G_2$, as one example. In yet another example, the flow rate of the tungsten-based gas, such as the dotted trace line $G_4$ in FIG. 4, may be supplied at a flow rate lower than the flow rate of the nitrogen-based gas, such as shown by the trace line $G_2$.

The bulk hardmask layer 312 is formed at a steady rate so as to maintain the bulk hardmask layer 312 with low defect density while bridging from the transition layer 311. In one embodiment, the tungsten-based gas supplied at operation 208 for forming the bulk hardmask layer 312 is controlled at between about 50 sccm and about 500 sccm. The nitrogen-based gas flow supplied at operation 208 for forming the bulk hardmask layer 312 is controlled at between 500 sccm and about 10000 sccm. Alternatively, the gases supplied in the main deposition gas mixture may be controlled at a ratio of the tungsten-based gas to the nitrogen-based gas between about 1:2 and about 1:50.

During deposition of the bulk hardmask layer 312, several process parameters may be regulated the process. In one embodiment suitable for processing a 300 mm substrate, the process pressure may be maintained at about 0.1 Torr to about 80 Torr, for example, about 1 Torr to about 20 Torr. A RF source power between about 100 Watts and about 1000 Watts is supplied in the seed layer gas mixture. A RF bias power between about 0 Watts and about 500 Watts may be optionally supplied in the seed layer gas mixture. The spacing between the substrate and showerhead may be controlled at about 200 mils to about 1000 mils. The substrate temperature of the deposition process is maintained between about 300 degrees Celsius and about 900 degrees Celsius, such as between about 480 degrees Celsius.

It is noted that the stress level of the bulk hardmask layer 312 may be adjusted by adjusting the RF bias power supplied during the main deposition process at operation 208. When the RF bias power is supplied at a higher level, a more compressive film of the bulk hardmask layer 312 may be obtained. In contrast, the RF bias power is supplied at a lower level, a more tensile film of the bulk hardmask layer 312 may be obtained.

In one example, the overall hardmask layer 314 (including the seed layer 310, the transition layer 311 and the bulk hardmask layer 312) may be in combination having a stress range between about −100 MPa and about +1000 MPa. It is believed that the seed layer 310 and the transition layer 311 formed in the hardmask layer 314 may assist providing a smooth film structure transition as well as providing a good adhesion to the substrate surface. The smooth film structure transition (e.g., predominately contributed from the transition layer 311) formed in the hardmask layer 314 may assist maintaining the hardmask layer 314 with minimum surface roughness, such as a surface roughness less than 1 nm Ra. Furthermore, grain sizes of the hardmask layer 314 may also be controlled, such as grain sizes less than 15 Å, so as to provide a good etching selectivity to serve as a mask layer during an etching/patterning process.

Figure 5:
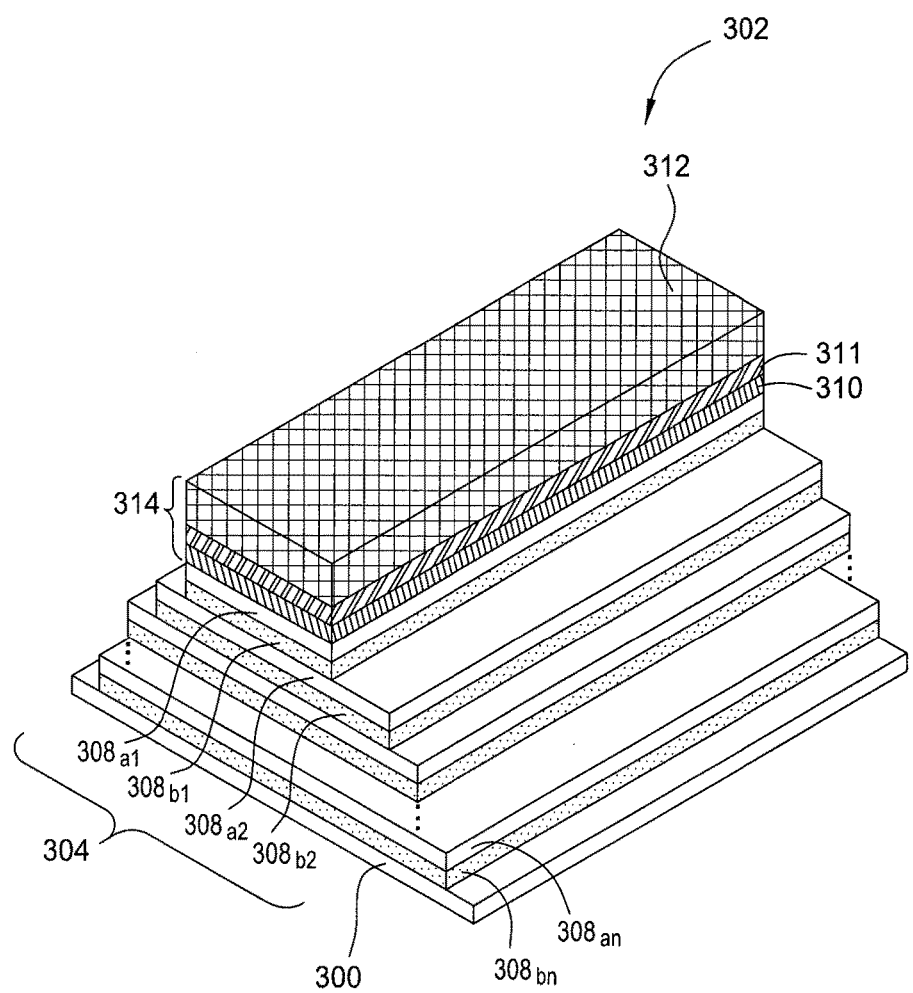
FIG. 5 depicts a schematic cross-sectional view of a stair-like structures formed on a substrate utilizing the hardmask layer formed from the process of FIG. 2.

After the hardmask layer 314 is formed on the substrate, the hardmask layer 314 may be utilized in an etching process as a patterning mask to form the structure 302, such as a stair like structure depicted in FIG. 5. In the example depicted in FIG. 5, only part of the bulk hardmask layer 312 remains on the substrate 300 as some portion of the first layer (shown as $308a_1, 308a_2, \ldots, 308a_n$) and the second layer (shown as $308b_1, 308b_2, \ldots, 308b_n$) in the film stack 304 has been trimmed, etched and patterned to form the stair-like structure as needed. It is noted that after the desired structure 302 is formed in the film stack 304, the hardmask layer 314 remaining on the substrate 300 may be removed as needed to complete the device manufacturing process.

Thus, methods and apparatus for forming a hardmask layer that may be utilized to form stair-like structures for manufacturing three dimensional (3D) stacking of semiconductor devices are provided. The hardmask layer may include a seed layer, transition layer and a bulk hardmask layer that provide a bonding structure with low surface roughness and high adhesion at the interface. By utilization of the hardmask layer with desired robust film properties and etching selectivity, an improved dimension and profile control of the resultant structures formed in a film stack may be obtained and the electrical performance of the chip devices may be enhanced in applications for three dimensional (3D) stacking of semiconductor devices.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a hardmask layer on a substrate comprises:
    forming a seed layer comprising boron on a film stack disposed on a substrate by supplying a seed layer gas mixture in a processing chamber, wherein the seed layer gas mixture comprises at least a boron containing gas and a nitrogen containing gas;
    forming a gradient transition layer comprising boron and tungsten on the seed layer by supplying a transition layer gas mixture in the same processing chamber, wherein the transition layer gas mixture is supplied to the processing chamber by ramping down a gas flow rate of the boron containing gas while maintaining a steady gas flow rate of the nitrogen containing gas to form the transition layer, and gradually ramping up a gas flow rate of a tungsten containing gas in the transition layer gas mixture; and forming a bulk hardmask layer comprising tungsten on the transition layer by supplying a deposition gas mixture in the same processing chamber, wherein the nitrogen containing gas is continuously supplied at the steady gas flow rate while forming the bulk hardmask layer.

2. The method of claim 1, wherein the film stack further comprises a first layer and a second layer repeatedly formed in the film stack.

3. The method of claim 2, wherein the first layer is a silicon oxide layer and the second layer is a silicon nitride layer.

4. The method of claim 1, wherein the transition layer has a higher tungsten concentration with the increase of a thickness of the transition layer.

5. The method of claim 1, wherein a gas flow rate of the tungsten containing gas is ramped up in the transition gas mixture while the gas flow rate of the boron containing gas is ramped down.

6. The method of claim 1, wherein the forming the bulk hardmask layer further comprises:

steadily supplying the tungsten containing gas in the processing chamber.

7. The method of claim 4, wherein forming the seed layer further comprises:

steadily supplying the boron containing gas and the nitrogen containing gas in the processing chamber.

8. The method of claim 1, wherein the film stack includes repeating layer structures formed in three dimensional NAND memory devices.

9. The method of claim 4, wherein forming the seed layer further comprises supplying a hydrogen containing gas into the processing chamber.

10. The method of claim 4, wherein the boron containing gas is $B_2H_6$ and the nitrogen containing gas is at least one of $N_2$ and $NH_3$.

11. The method of claim 1, wherein the tungsten containing gas is $WF_6$.

12. The method of claim 1, wherein the seed layer is a boron nitride layer and the transition layer is a boron tungsten nitride layer and the bulk hardmask layer is a tungsten nitride layer.

13. A method of forming a hardmask layer comprising:

supplying a gas mixture including at least a boron containing gas and a nitrogen containing gas onto a surface of a substrate disposed in a processing chamber to form a seed layer on the substrate;

ramping down the boron containing gas and ramping up a tungsten containing gas supplied in the gas mixture while maintaining a steady flow of the nitrogen containing gas into the same processing chamber to form a gradient transition layer on the seed layer; and continuously supplying the tungsten containing gas in the gas mixture until the tungsten containing gas reaching to a predetermined flow rate and maintaining the tungsten containing gas at a steady predetermined flow rate to form a bulk hardmask layer comprising tungsten in the same processing chamber, wherein the nitrogen containing gas is continuously supplied at the steady gas flow rate while maintaining the tungsten containing gas at the steady predetermined flow rate.

14. The method of claim 13, wherein the seed layer is a boron nitride layer, the transition layer is a boron tungsten nitride layer, and the bulk hardmask layer is a tungsten nitride layer.

* * * * *